United States Patent
Wang (10) Patent No.: US 11,348,946 B2
(45) Date of Patent: May 31, 2022

(54) DISPLAY PANEL AND DISPLAY MODULE

(71) Applicant: Wuhan China Star Optoelectronics Semiconductor Display Technology Co., Ltd., Wuhan (CN)

(72) Inventor: Guochao Wang, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 327 days.

(21) Appl. No.: 16/634,149

(22) PCT Filed: Sep. 29, 2019

(86) PCT No.: PCT/CN2019/108837
§ 371 (c)(1),
(2) Date: Jan. 26, 2020

(87) PCT Pub. No.: WO2021/031295
PCT Pub. Date: Feb. 25, 2021

(65) Prior Publication Data
US 2021/0375949 A1    Dec. 2, 2021

(30) Foreign Application Priority Data

Aug. 19, 2019 (CN) .......................... 201910762983.5

(51) Int. Cl.
*H01L 27/12* (2006.01)
*H01L 27/32* (2006.01)

(52) U.S. Cl.
CPC ...... *H01L 27/1218* (2013.01); *H01L 27/1248* (2013.01); *H01L 27/3244* (2013.01); *H01L 27/3262* (2013.01)

(58) Field of Classification Search
CPC ............. H01L 27/1218; H01L 27/1248; H01L 27/3244; H01L 27/3262
See application file for complete search history.

(56) References Cited

U.S. PATENT DOCUMENTS

| | | | |
|---|---|---|---|
| 11,119,591 B2 * | 9/2021 | Hong | G02F 1/133305 |
| 2005/0186712 A1 * | 8/2005 | Smith | G02F 1/1362 257/E21.705 |
| 2006/0285055 A1 * | 12/2006 | Tanaka | G02F 1/1339 349/153 |

(Continued)

FOREIGN PATENT DOCUMENTS

| | | |
|---|---|---|
| CN | 106054465 | 10/2016 |
| CN | 108022878 | 5/2018 |

(Continued)

*Primary Examiner* — Mohsen Ahmadi (57) ABSTRACT

The present disclosure discloses a display panel and a display module comprising a display area, a crack protection area surrounding the display area, and a cutting area located at a periphery of the crack protection area. A recess surrounding the display area is disposed in the crack protection area and the supporting member is located in the recess. The supporting member has a surface away from one side of the substrate, and the surface has a height defined in a direction perpendicular to the base substrate which is not higher than a height of a contact surface between the base substrate and the array layer in the direction perpendicular to the base substrate.

16 Claims, 6 Drawing Sheets

(56) References Cited

U.S. PATENT DOCUMENTS

| | | | |
|---|---|---|---|
| 2007/0004125 A1* | 1/2007 | Watanabe | H01L 27/1214 |
| | | | 257/E21.597 |
| 2009/0015779 A1* | 1/2009 | Ohashi | G02F 1/1341 |
| | | | 349/154 |
| 2014/0326121 A1 | 11/2014 | Kim | |
| 2016/0315134 A1* | 10/2016 | Nishido | H01L 51/0097 |
| 2017/0066241 A1* | 3/2017 | Naganuma | B41J 2/1628 |
| 2019/0051979 A1* | 2/2019 | Lin | H01Q 9/0407 |

FOREIGN PATENT DOCUMENTS

| | | |
|---|---|---|
| CN | 108198950 | 6/2018 |
| CN | 108598287 | 9/2018 |
| CN | 108649141 | 10/2018 |
| CN | 109616506 | 4/2019 |
| CN | 109872629 | 6/2019 |
| CN | 110048014 | 7/2019 |
| JP | 2013-073182 | 3/2013 |

* cited by examiner

DISPLAY PANEL AND DISPLAY MODULE

RELATED APPLICATIONS

This application is a National Phase of PCT Patent Application No. PCT/CN2019/108837 having International filing date of Sep. 29, 2019, which claims the benefit of priority of Chinese Patent Application No. 201910762983.5 filed on Aug. 19, 2019. The contents of the above applications are all incorporated by reference as if fully set forth herein in their entirety.

FIELD AND BACKGROUND OF THE INVENTION

The present disclosure relates to a field of displays, and more particularly to a display panel and a display module.

BACKGROUND OF THE INVENTION

In a conventional manufacturing process of a flat plate display (FPD), a display panel is finally obtained through a plurality of cutting processes, which a mother board of the display panel must undergo.

In the conventional cutting processes of the mother board of the display panel, cracks frequently occur near a cutting path. The cracks may damage a functional film layer if the cracks extend to an inside (an effective display area) of the display panel, thereby affecting display quality. A crack stop is typically designed on an inside of the cutting path to avoid extension of the cracks.

The current crack stop design is mainly groove on the inorganic film. However, the effect of the current crack stop is not effective enough, such that the cracks extend to the inside of the display panel, thereby affecting the product yield.

As a result, it is necessary to provide a display panel to solve the problems existing in the conventional technology, as described above.

SUMMARY OF THE INVENTION

The present disclosure provides a display panel and a display module to solve a technical problem that the cracks occurring in the conventional cutting processes for the display panel may damage the inside of the display panel.

To solve the above problem, the technical solutions of the present disclosure are provided as follows:

the present disclosure provides a display panel which comprises a display area, a crack protection area surrounding the display area, and a cutting area located at a periphery of the crack protection area;

the display area is provided with a base substrate, an array layer disposed on the base substrate and a planarization layer disposed on the array layer;

the crack protection area is provided with the base substrate, a supporting member disposed on the base substrate, and the planarization layer disposed on the supporting member;

the crack protection area is further provided with a recess surrounding the display area and located inside the base substrate, and the supporting member is located in the recess;

wherein the supporting member has a surface away from one side of the substrate, and the surface has a height defined in a direction perpendicular to the base substrate which is not higher than a height of a contact surface between the base substrate and the array layer in the direction perpendicular to the base substrate.

In the display panel of the disclosure, the display panel at least comprises a first substrate and a second substrate disposed on the first substrate; the recess is located in the first substrate; the supporting member has a surface away from one side of the first substrate, and the surface has a height defined in a direction perpendicular to the base substrate which is not higher than a height of a contact surface between the first substrate and the second substrate in the direction perpendicular to the base substrate.

In the display panel of the disclosure, the second substrate located in the crack protection area comprises a first opening; an orthographic projection of the first opening on the first substrate is located in the recess.

In the display panel of the disclosure, the second substrate exceeds a boundary of the recess and extends to a central axis of the supporting member in a direction from the display area to the crack protection area; the first substrate, the second substrate and the supporting member form a hollow area in the recess.

In the display panel of the disclosure, there is an overlapped portion between the supporting member and the second substrate in the direction of the top view of the display panel;

the overlapped portion comprises a first overlapped portion, one end of the supporting member close to the display area of the display panel and the second substrate form the first overlapped portion; or the overlapped portion comprises a second overlapped portion, one end of the supporting member away from the display area of the display panel and the second substrate form the second overlapped portion; or the overlapped portion comprises a first overlapped portion and a second overlapped portion, one end of the supporting member close to the display area of the display panel and the second substrate form the first overlapped portion, and one end of the supporting member away from the display area of the display panel and the second substrate form the second overlapped portion.

In the display panel of the disclosure, the recess in the crack protection area is continuously or discontinuously disposed around the display area in a clockwise or a counter-clockwise direction; wherein in the direction of the top view of the display panel, the recess and the boundary of the display area of the display panel are disposed in parallel, or the recess is disposed in a curve line or in a polyline.

In the display panel of the disclosure, at least one of the recesses is disposed in the crack protection area in a direction from the display area to the crack protection area.

In the display panel of the disclosure, a first recess close to the display area and a second recess away from the display area are discontinuously disposed in the crack protection area; the first recesses and the second recess are alternately disposed.

In the display panel of the disclosure, the supporting member comprises at least one inorganic layer; the at least one inorganic layer in the supporting member and a corresponding layer in the array layer are formed together in the same process.

In the display panel of the disclosure, a width of the supporting member is equal to a width of the inorganic layer in the array layer.

The present disclosure further provides a display module which comprises a display panel, a polarizer layer on the display panel, and a cover layer on the polarizer layer, and the display panel comprises a display area, a crack protection area surrounding the display area, and a cutting area located at a periphery of the crack protection area;

the display area is provided with a base substrate, an array layer disposed on the base substrate and a planarization layer disposed on the array layer;

the crack protection area is provided with the base substrate, a supporting member disposed on the base substrate, and the planarization layer disposed on the supporting member;

the crack protection area is further provided with a recess surrounding the display area and located inside the base substrate, and the supporting member being located in the recess;

wherein the supporting member has a surface away from one side of the substrate, and the surface has a height defined in a direction perpendicular to the base substrate which is not higher than a height of a contact surface of the base substrate and the array layer in the direction perpendicular to the base substrate.

In the display module of the disclosure, the base substrate at least comprises a first substrate and a second substrate disposed on the first substrate; the recess is located in the first substrate; the supporting member has a surface away from one side of the first substrate, and the surface has a height defined in a direction perpendicular to the base substrate which is not higher than a height of a contact surface of the first substrate and the second substrate in the direction perpendicular to the base substrate.

In the display module of the disclosure, the second substrate located in the crack protection area comprises a first opening; an orthographic projection of the first opening on the first substrate is located in the recess.

In the display module of the disclosure, the second substrate exceeds a boundary of the recess and extends to a central axis of the supporting member in a direction from the display area to the crack protection area; the first substrate, the second substrate and the supporting member form a hollow area in the recess.

In the display module of the disclosure, there is an overlapped portion between the supporting member and the second substrate in the direction of the top view of the display panel;

the overlapped portion comprises a first overlapped portion, one end of the supporting member close to the display area of the display panel and the second substrate form the first overlapped portion; or the overlapped portion comprises a second overlapped portion, one end of the supporting member away from the display area of the display panel and the second substrate form the second overlapped portion; or the overlapped portion comprises a first overlapped portion and a second overlapped portion, one end of the supporting member close to the display area of the display panel and the second substrate form the first overlapped portion, and one end of the supporting member away from the display area of the display panel and the second substrate form the second overlapped portion.

In the display module of the disclosure, the recess in the crack protection area is continuously or discontinuously disposed around the display area in a clockwise or a counter-clockwise direction; wherein in the direction of the top view of the display panel, the recess and the boundary of the display area of the display panel are disposed in parallel, or the recess is disposed in a curve line or in a polyline.

In the display module of the disclosure, at least one of the recesses is disposed in the crack protection area in a direction from the display area to the crack protection area.

In the display module of the disclosure, a first recess close to the display area and a second recess away from the display area are discontinuously disposed in the crack protection area; the first recesses and the second recess are alternately disposed.

In the display module of the disclosure, the supporting member comprises at least one inorganic layer; the at least one inorganic layer in the supporting member and a corresponding layer in the array layer are formed together in the same process.

In the display module of the disclosure, a width of the supporting member is equal to a width of the inorganic layer in the array layer.

Beneficial Effect

In the present disclosure, by defining the recess in the crack protection area, and disposing the supporting member in the recess, the supporting member does not contact the inorganic layer in the array layer. When the panel is being cut, a discontinuous design of the inorganic layer in the panel makes force not be delivered to the display area, such that crack damage to the display area is avoided, and the product yield is increased.

BRIEF DESCRIPTION OF THE SEVERAL VIEWS OF THE DRAWINGS

In order to clearly illustrate the embodiments of the present disclosure or the technical solution in the prior art, accompanying drawings for describing the embodiments or the prior art are simply introduced in the following content. Apparently, the accompanying drawings described below are only some embodiments of the present disclosure. A person of ordinary skill in the art, without creative efforts, can derive other drawings from these drawings.

DETAILED DESCRIPTION OF THE SPECIFIC EMBODIMENTS OF THE INVENTION

The following description of the embodiments with reference to the accompanying drawings is used to illustrate particular embodiments of the present disclosure. The directional terms referred in the present disclosure, such as "upper", "lower", "front", "back", "left", "right", "inner", "outer", "side surface", etc. are only directions with regard to the accompanying drawings. Therefore, the directional terms used for describing and illustrating the present disclosure are not intended to limit the present disclosure. In the drawings, structurally similar elements are denoted by the same reference numerals.

The following description of the embodiments with reference to the accompanying drawings is used to illustrate particular embodiments of the present disclosure. The directional terms referred in the present disclosure, such as "upper", "lower", "front", "back", "left", "right", "inner", "outer", "side surface", etc. are only directions with regard to the accompanying drawings. Therefore, the directional terms used for describing and illustrating the present disclosure are not intended to limit the present disclosure. In the drawings, structurally similar elements are denoted by the same reference numerals.

In the conventional cutting processes of the mother board of the display panel, cracks frequently occur near the cutting path. When the cracks extend to the inside of the display panel, a structure therein is damaged if there is no necessary protective means, thereby affecting display quality. Hence, the present disclosure provides the display panel to solve the above-mentioned technical problem.

Figure 1:
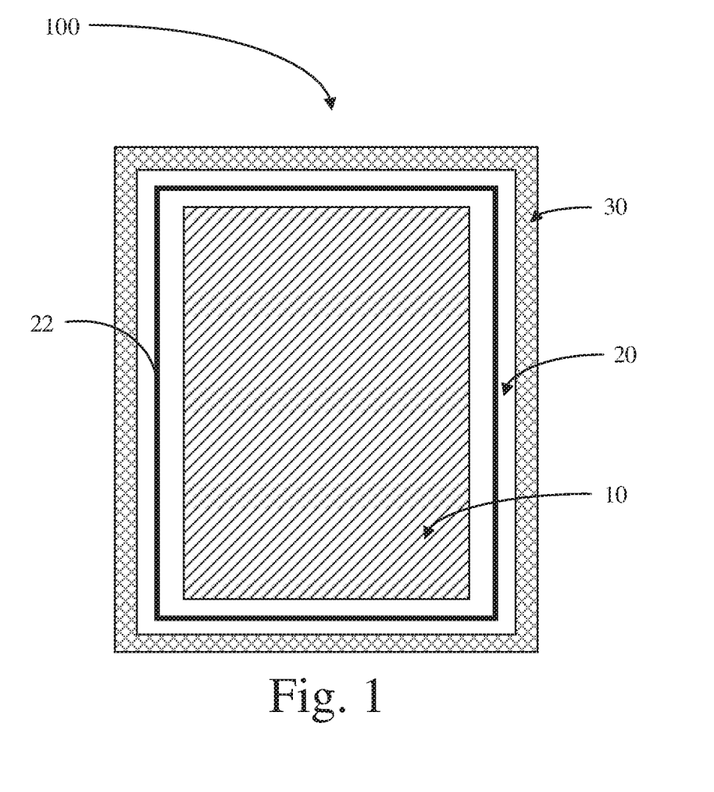
FIG. 1 is a first top structural diagram of a display panel according to the present disclosure.

Refer to FIG. 1. FIG. 1 is a first top structural diagram of a display panel according to the present disclosure.

The display panel 100 comprises a display area 10, a crack protection area 20 surrounding the display area 10, and a cutting area 30 located at a periphery of the crack protection area 20.

Figures 2, 3:
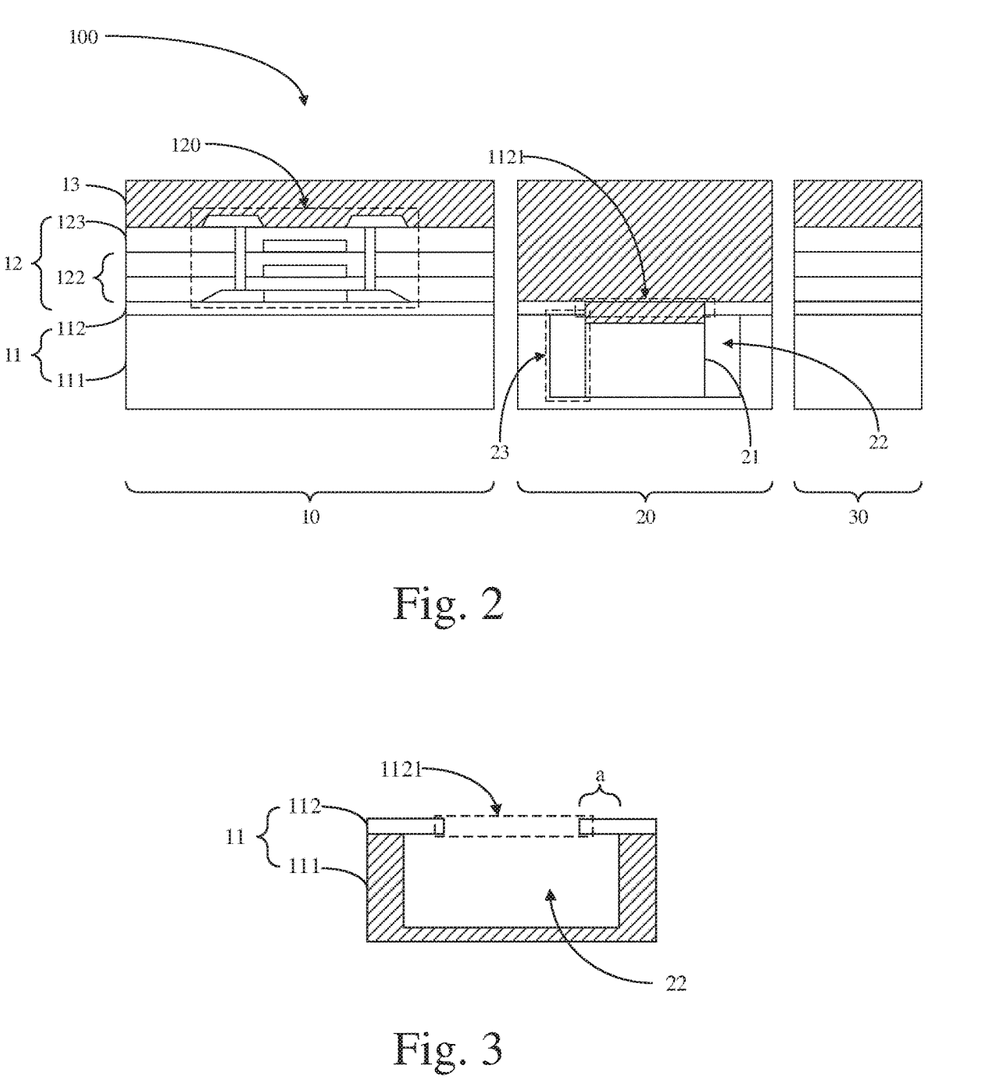
FIG. 2 is a first structural diagram of a display panel according to the present disclosure.
FIG. 3 is a first cross-sectional view of a recess of a display panel according to the present disclosure.
Figure 4:
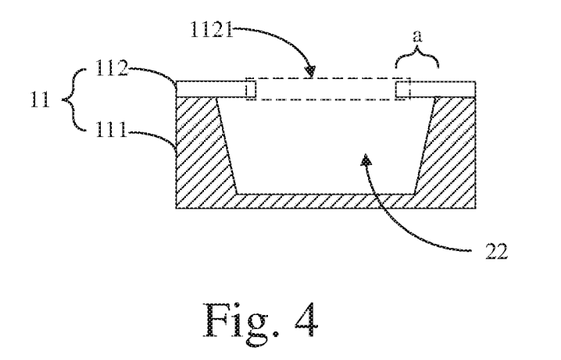
FIG. 4 is a second cross-sectional view of a recess of a display panel according to the present disclosure.
Figure 5:
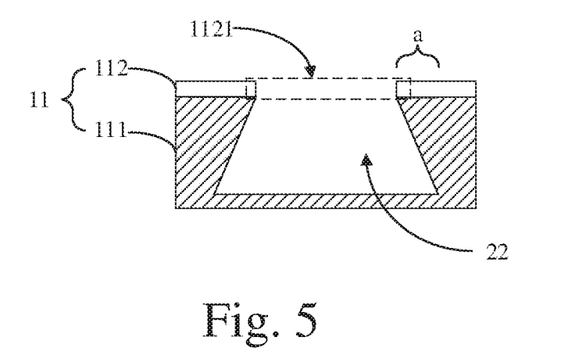
FIG. 5 is a third cross-sectional view of a recess of a display panel according to the present disclosure.
Figure 6:
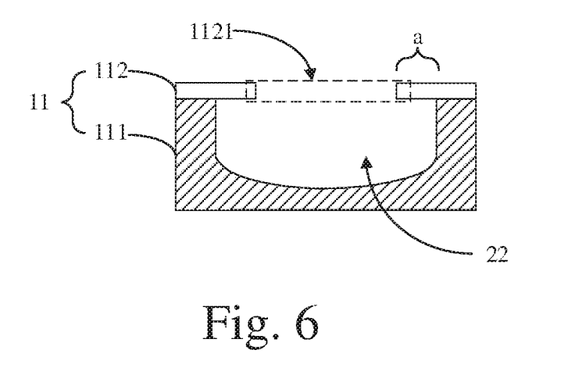
FIG. 6 is a fourth cross-sectional view of a recess of a display panel according to the present disclosure.

Refer to FIG. 2. FIG. 2 is a first structural diagram of a display panel according to the present disclosure.

The display area 10 is provided with a base substrate 11, an array layer 12 disposed on the base substrate 11, and a planarization layer 13 disposed on the array layer 12.

The crack protection area 20 is provided with the base substrate 11, a supporting member 21 disposed on the base substrate 11, and the planarization layer 13 disposed on the supporting member 21.

The crack protection area 20 is further provided with a recess 22 surrounding the display area 10 and located inside the base substrate 11, and the supporting member 21 is located in the recess 22.

In the embodiment, the supporting member 21 has a surface away from one side of the base substrate 11, and the surface has a height defined in a direction perpendicular to the base substrate 11, which is not higher than a height of a contact surface between the base substrate 11 and the array layer 12 in the direction perpendicular to the base substrate 11.

Refer to FIG. 2. In the display area 10, the base substrate 11 may at least comprise a first substrate 111 and a second substrate 112 disposed on the first substrate 111. The first substrate 111 and the second substrate 112 is made of material with different etching rates.

In the embodiment, the first substrate 111 may be made of flexible organic material, such as polyimide (PI), etc. The second substrate 112 may be made of rigid inorganic material, such as a quartz substrate or a resin substrate.

In the embodiment, a plurality of the first substrate 111 and the second substrate 112 may be layered to form the base substrate 11, but are not limited thereto.

The array layer 12 may comprise a plurality of thin film transistors 120, and the thin film transistors 120 may be one structure selected from etch-stop type, back-channel etch type, or top-gate transistor, etc., but are not limited thereto.

An example of a top-gate transistor is illustrated in accordance with the present disclosure.

For example, the top-gate transistor may include a source layer 121, a gate insulating layer 122, a gate layer, an interlayered dielectric layer 123, a drain layer, etc.

The thin film transistor 120 in FIG. 2 is a double layered-gate structure, which includes two-layered gate insulating layer 122. The embodied structure is not repeated herein.

Refer to FIG. 2. In the cutting area 30, the base substrate 11 in this area is the same as the base substrate 11 in the display area 10, which is made of the first substrate 111 and the second substrate 112, or is made of the first substrate 111 and the second substrate 112 stacked in layers.

A plurality of layers are disposed on the base substrate 11, such as a buffer layer, a gate insulating layer 122, an interlayered dielectric layer 123, and a planarization layer 13 disposed on the interlayered dielectric layers 123.

In the embodiment, the layers in the cutting area 30 and the corresponding layers in the display area 10 are formed together in the same process.

Refer to FIG. 2. In the crack protection area 20, the base substrate 11 in this area is made of the first substrate 111 and the second substrate 112.

In the embodiment, the recess 22 is located in the first substrate 111.

The supporting member 21 has a surface away from one side of the first substrate 111, and the surface has a height defined in a direction perpendicular to the base substrate which is not higher than a height of a contact surface between the first substrate 111 and the second substrate 112 in the direction perpendicular to the base substrate 11.

In the embodiment, the second substrate 112 located in the crack protection area 20 comprises a first opening 1121, and an orthographic projection of the first opening 1121 on the first substrate 11 is located in the recess 22.

In the base substrate 11 in this area, the recess 22 may be formed on the first substrate 111, and the first opening 1121 may be formed on the second substrate 112 by a dry etching process. A circle as shown in FIG. 1 is formed according to the different etching rates of the first substrate 111 and the second substrate 112.

In the embodiment, the dry etching process may utilize one gas selected from oxygen, carbon tetrafluoride, sulfur hexafluoride, etc. or a gas combination thereof, to etch the base substrate 11.

Refer to FIG. 2 and FIGS. 3-6. The second substrate 112 exceeds a boundary of the recess 22 and extends towards a central axis of the supporting member 21 in a direction from the display area 10 to the crack protection area 20.

The distance in which the second substrate 112 exceeds the boundary of the recess 22 is "a".

In the embodiment, the distance "a" is larger than or equal to 0.5 micro meters.

In the embodiment, the first substrate 111, the second substrate 112 and the supporting member 21 form a hollow area 23 in the recess 22.

The supporting member 21 includes at least an inorganic layer. The supporting member 21 may be formed in the recess 22 through a single process.

In the embodiment, the at least one inorganic layer in the supporting member 21 and a corresponding layer in the array layer are formed together in the same process For example, the supporting member 21 is made of the gate insulating layer 122 and the interlayered dielectric layer 123. Otherwise, the supporting member 21 is made of the buffer layer, the gate insulating layers 122 and the interlayered dielectric layer 123.

In the embodiment, for process simplicity, the layer structure in the supporting member 12 is the same as the insulating layer in the array layer 12.

In the embodiment, a thickness of the supporting member 21 is equal to a thickness of an inorganic layer in the array layer 12.

Refer to FIGS. 3-6. FIGS. 3-6 are cross-sectional views of the recess 22.

The recess 22 may be one shape selected from a rectangle, a regular trapezoid, an inverted trapezoid, a semicircle, etc.

Since the recess 22 is disposed around the display area 10, the sectional view of the recess 22 may be a combination of the above-mentioned shapes, but is not limited thereto.

Refer to FIGS. 2-6. In the direction of the top view of the display panel 100, there may be no overlapped portion 24 between the supporting member 21 and the second substrate 112, and there is a necessary gap therebetween. When the mother board of the display panel 100 is being cut, the supporting member 21 in the recess 22 and the inorganic layer on the second substrate 112 are separate and only connected with each other by the planarization layer 13 on the supporting member 21, and the flexible organic layer cannot transfer force, such that the cracks occurring in the cutting process cannot extend from the layers in the cutting area 30 to the array layer 12 in the display area 10.

Figure 7:
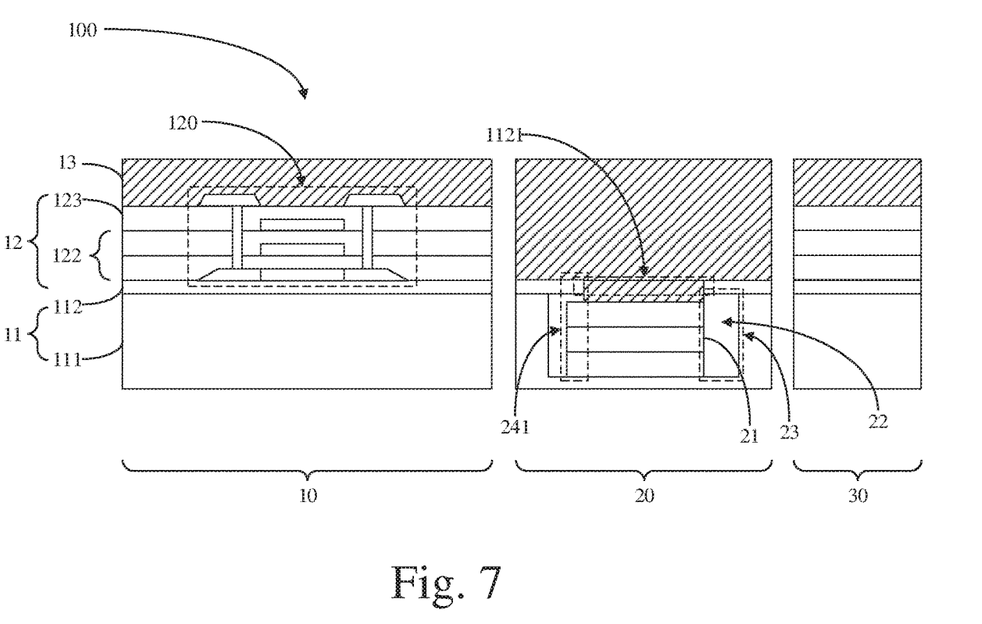
FIG. 7 is a second structural diagram of a display panel according to the present disclosure.
Figure 8:
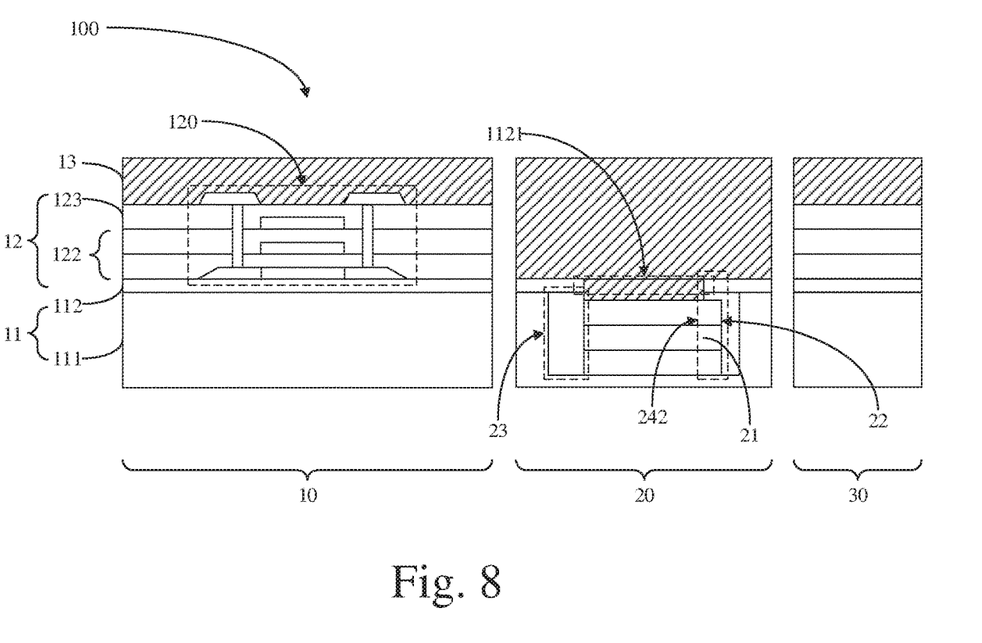
FIG. 8 is a third structural diagram of a display panel according to the present disclosure.
Figure 9:
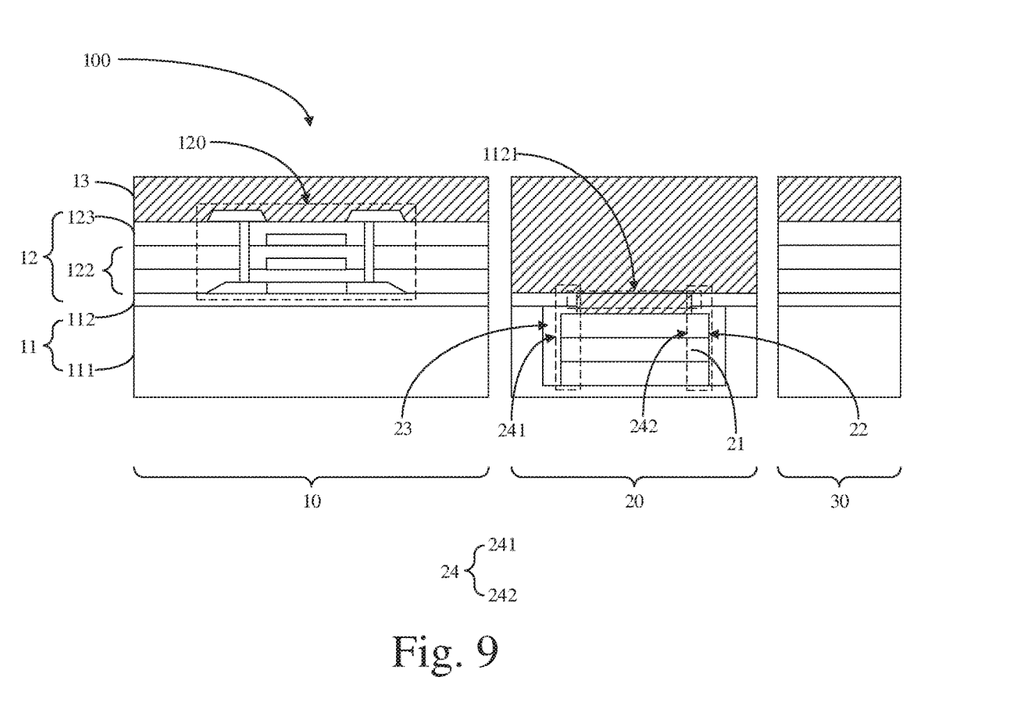
FIG. 9 is a fourth structural diagram of a display panel according to the present disclosure.

Refer to FIGS. 7-9. In the direction of the top view of the display panel 100, there is an overlapped portion between the supporting member 21 and the second substrate 112.

In FIGS. 2-6, there may be a gap between the supporting member 21 and the second substrate 112. The layers located in the gap are the base substrate 11 and the planarization layer 13. The base substrate 11 and the planarization layer 13 are made of organic flexible material. If there is no corresponding inorganic layer to support the area, the area may be easily damaged, thereby causing the technical problem of panel fragmentation, etc.

Refer to FIG. 7. FIG. 7 is a second structural diagram of a display panel according to the present disclosure. The overlapped portion 24 includes a first overlapped portion 241, one end of the supporting member 21 close to the display area 10 of the display panel 100 and the second substrate 112 form the first overlapped portion 241. There may be a gap between one end of the supporting member 21 away from the display area 10 of the display panel 100 and the second substrate 112.

Refer to FIG. 8. FIG. 8 is a third structural diagram of a display panel according to the present disclosure.

The overlapped portion 24 includes a second overlapped portion 242, one end of the supporting member 21 away from the display area 10 of the display panel 100 and the second substrate 112 form the second overlapped portion 242. There may be a gap between one end of the supporting member 21 close to the display area 10 of the display panel 100 and the second substrate 112.

Refer to FIG. 9. FIG. 9 is a fourth structural diagram of a display panel according to the present disclosure.

The overlapped portion 24 comprises a first overlapped portion 241 and a second overlapped portion 242, one end of the supporting member 21 close to the display area 10 of the display panel 100 and the second substrate 112 form the first overlapped portion 241, and one end of the supporting member 21 away from the display area 10 of the display panel 100 and the second substrate 112 form the second overlapped portion 242. In the embodiment, there is no gap between the supporting member 21 and the second substrate 112.

The embodiment in FIG. 9 is a combination of FIG. 7 and FIG. 8. The embodiments in FIG. 7 and FIG. 8 are able to solve the technical problems of cutting crack delivery and support, but the technical effect thereof is weaker than that of the embodiment in FIG. 9. However, the manufacturing process for the panel in FIG. 9 is more difficult than that in FIG. 7 and FIG. 8.

The recess 22 in the crack protection area 20 is continuously or discontinuously disposed around the display area 10 in a clockwise or a counter-clockwise direction.

In the direction of the top view of the display panel 100, the recess 22 and the boundary of the display area 10 of the display panel 100 are disposed in parallel, or the recess 22 is disposed in a curve line or in a polyline.

Figure 10:
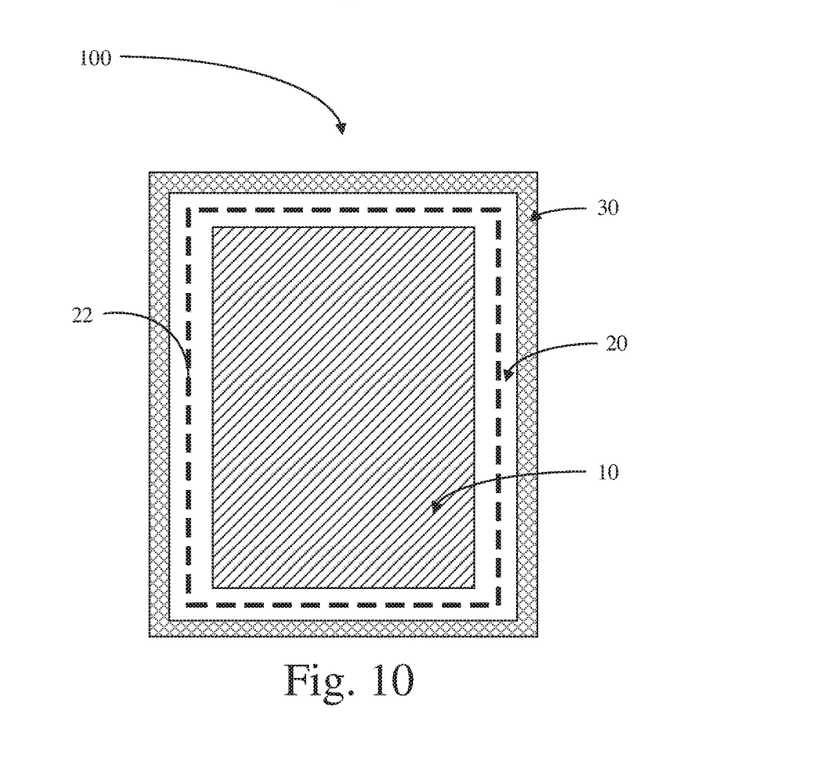
FIG. 10 is a second top structural diagram of a display panel according to the present disclosure.

Refer to FIG. 10. FIG. 10 is a second top structural diagram of a display panel according to the present disclosure.

The dotted lines in the crack protection area 20 represent an outline in which the recesses 22 are disposed discontinuously in the embodiment. The dotted lines may be parallel to or not parallel to the peripheral boundary of the display area 10.

In the display panel 100 of the present disclosure, at least one of the recesses 22 is disposed in the crack protection area 20 in a direction from the display area 10 to the crack protection area 20.

Figure 11:
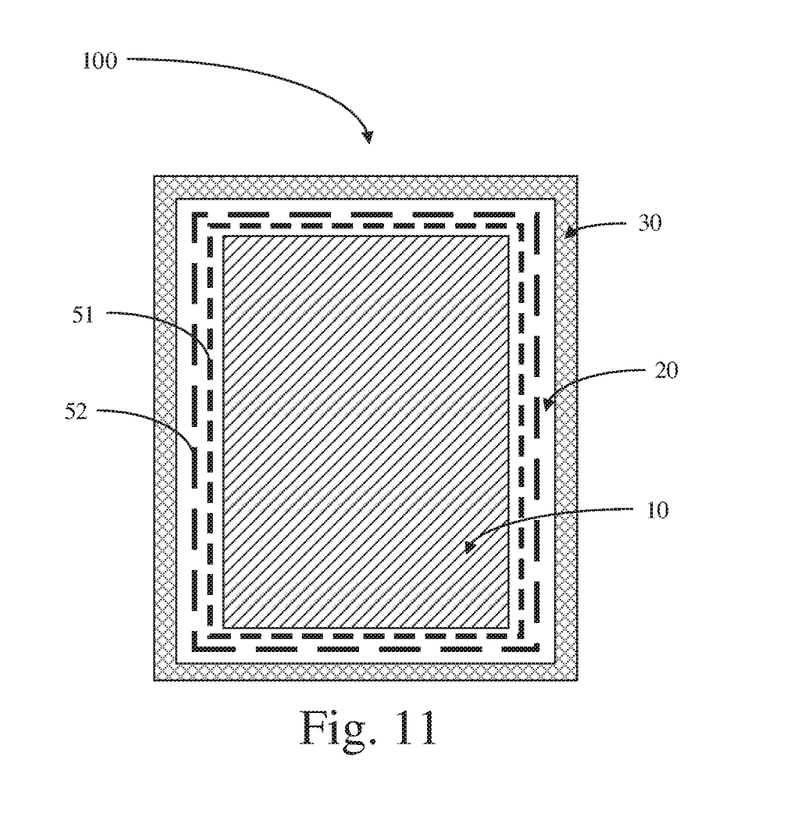
FIG. 11 is a third top structural diagram of a display panel according to the present disclosure.

Refer to FIG. 11. FIG. 11 is a top structural diagram of a display panel according to the present disclosure.

A first recess 51 close to the display area 10 and a second recess 52 away from the display area 10 are discontinuously disposed in the crack protection area 20. When the recesses 22 are disposed discontinuously, the first recess 51 and the second recess 52 may be alternately disposed, so as to prevent cutting stress from being transferred from the non-recess 22 area between the two adjacent recesses 22 to the inside of the display panel 100.

In one embodiment, the recesses may be disposed in a spiral manner in the crack protection area. The recesses disposed in a spiral manner may be parallel to or not parallel to the boundary of the display area.

The present disclosure further provides a display module, wherein the display module comprises a display panel, a polarizer layer on the display panel, and a cover layer on the polarizer layer. The working principles of the display module are identical to or similar to those of the display panel, and are not repeated herein.

The present disclosure further provides a display device, wherein the display device comprises the above-mentioned display module. The working principles of the display device are identical to or similar to those of the display module, and are not repeated herein.

The present disclosure provides a display panel and a display module, which comprise a display area, a crack protection area surrounding the display area, and a cutting area located at a periphery of the crack protection area. The crack protection area is provided with a recess surrounding the display area, and the supporting member is disposed in the recess. The supporting member has a surface away from one side of the base substrate, and the surface has a height defined in a direction perpendicular to the base substrate which is not higher than a height of a contact surface between the base substrate and the array layer in the direction perpendicular to the base substrate. In the present disclosure, by defining the recess in the crack protection area, and disposing the supporting member in the recess, the supporting member does not contact the inorganic layer in the array layer. When the panel is being cut, a discontinuous design of the inorganic layer in the panel makes force not be delivered to the display area, such that crack damage to the display area is avoided, and the product yield is increased.

Based on the above, the present disclosure has been described with a preferred embodiment thereof, but the above preferred embodiment is not to limit the scope of the present disclosure. Those skilled in the art may make many changes and modifications to the described embodiments without departing from the scope and the spirit of the present disclosure that is intended to be limited only by the appended claims.

What is claimed is:

1. A display panel, comprising a display area, a crack protection area surrounding the display area, and a cutting area located at a periphery of the crack protection area;
    the display area being provided with a base substrate, an array layer disposed on the base substrate, and a planarization layer disposed on the array layer;
    the crack protection area being provided with the base substrate, a supporting member disposed on the base substrate, and the planarization layer disposed on the supporting member; and
    the crack protection area being further provided with a recess surrounding the display area and located inside the base substrate, and the supporting member being located in the recess;
    wherein the supporting member has a surface away from one side of the base substrate, and the surface has a height defined in a direction perpendicular to the base substrate which is not higher than a height of a contact surface of the base substrate and the array layer in the direction perpendicular to the base substrate;
    wherein at least one of the recesses is disposed in the crack protection area in a direction from the display area to the crack protection area;
    wherein a first recess close to the display area and a second recess away from the display area are discontinuously disposed in the crack protection area;
    the first recess and the second recess are alternately disposed.

2. The display panel as claimed in claim 1, wherein the base substrate at least comprises a first substrate and a second substrate disposed on the first substrate;
    the recess is located in the first substrate; and
    the supporting member has a surface away from one side of the first substrate, and the surface has a height defined in a direction perpendicular to the base substrate which is not higher than a height of a contact surface between the first substrate and the second substrate in the direction perpendicular to the base substrate.

3. The display panel as claimed in claim 2, wherein the second substrate located in the crack protection area comprises a first opening; and
    an orthographic projection of the first opening on the first substrate is located in the recess.

4. The display panel as claimed in claim 3, wherein the second substrate exceeds a boundary of the recess and extends to a central axis of the supporting member in a direction from the display area to the crack protection area; and
    the first substrate, the second substrate and the supporting member form a hollow area in the recess.

5. The display panel as claimed in claim 4, wherein there is an overlapped portion between the supporting member and the second substrate in the direction of the top view of the display panel;
    the overlapped portion comprises a first overlapped portion, wherein one end of the supporting member close to the display area of the display panel and the second substrate form the first overlapped portion; or
    the overlapped portion comprises a second overlapped portion, one end of the supporting member away from the display area of the display panel and the second substrate form the second overlapped portion; or
    the overlapped portion comprises a first overlapped portion and a second overlapped portion, one end of the supporting member close to the display area of the display panel and the second substrate form the first overlapped portion, and one end of the supporting member away from the display area of the display panel and the second substrate form the second overlapped portion.

6. The display panel as claimed in claim 1, wherein the recess in the crack protection area is continuously or discontinuously disposed around the display area in a clockwise or a counter-clockwise direction;
    wherein in the direction of the top view of the display panel, the recess and the boundary of the display area of the display panel are disposed in parallel, or the recess is disposed in a curve line or in a polyline.

7. The display panel as claimed in claim 1, wherein the supporting member comprises at least one inorganic layer;
    the at least one inorganic layer in the supporting member and a corresponding layer in the array layer are formed together in the same process.

8. The display panel as claimed in claim 7, wherein a width of the supporting member is equal to a width of the inorganic layer in the array layer.

9. A display module, comprising a display panel, a polarizer layer on the display panel, a cover layer on the polarizer layer, and the display panel comprises a display area, a crack protection area surrounding the display area and a cutting area located at a periphery of the crack protection area;
    the display area being provided with a base substrate, an array layer disposed on the base substrate, and a planarization layer disposed on the array layer;
    the crack protection area being provided with the base substrate, a supporting member disposed on the base substrate, and the planarization layer disposed on the supporting member; and
    the crack protection area being further provided with a recess surrounding the display area and located inside the base substrate, and the supporting member being located in the recess;
    wherein the supporting member has a surface away from one side of the base substrate, and the surface has a height defined in a direction perpendicular to the base substrate which is not higher than a height of a contact surface of the base substrate and the array layer in the direction perpendicular to the base substrate;
    wherein at least one of the recesses is disposed in the crack protection area in a direction from the display area to the crack protection area;
    wherein a first recess close to the display area and a second recess away from the display area are discontinuously disposed in the crack protection area;
    the first recess and the second recess are alternately disposed.

10. The display module as claimed in claim 9, wherein the base substrate at least comprises a first substrate and a second substrate disposed on the first substrate;

the recess is located in the first substrate; and the supporting member has a surface away from one side of the first substrate, and the surface has a height defined in a direction perpendicular to the base substrate which is not higher than a height of a contact surface of the first substrate and the second substrate in the direction perpendicular to the base substrate.

11. The display module as claimed in claim 10, wherein the second substrate located in the crack protection area comprises a first opening; and an orthographic projection of the first opening on the first substrate is located in the recess.

12. The display module as claimed in claim 11, wherein the second substrate exceeds a boundary of the recess and extends to a central axis of the supporting member in a direction from the display area to the crack protection area; and the first substrate, the second substrate and the supporting member form a hollow area in the recess.

13. The display module as claimed in claim 12, wherein there is an overlapped portion between the supporting member and the second substrate in the direction of the top view of the display panel;

the overlapped portion comprises a first overlapped portion, wherein one end of the supporting member close to the display area of the display panel and the second substrate form the first overlapped portion; or the overlapped portion comprises a second overlapped portion, one end of the supporting member away from the display area of the display panel and the second substrate form the second overlapped portion; or the overlapped portion comprises a first overlapped portion and a second overlapped portion, one end of the supporting member close to the display area of the display panel and the second substrate form the first overlapped portion, and one end of the supporting member away from the display area of the display panel and the second substrate form the second overlapped portion.

14. The display module as claimed in claim 9, wherein the recess in the crack protection area is continuously or discontinuously disposed around the display area in a clockwise or a counter-clockwise direction;

wherein in the direction of the top view of the display panel, the recess and the boundary of the display area of the display panel are disposed in parallel, or the recess is disposed in a curve line or in a polyline.

15. The display module as claimed in claim 9, wherein the supporting member comprises at least one inorganic layer;

the at least one inorganic layer in the supporting member and a corresponding layer in the array layer are formed together in the same process.

16. The display module as claimed in claim 15, wherein a width of the supporting member is equal to a width of the inorganic layer in the array layer.

* * * * *